(12) United States Patent
Yang et al.

(10) Patent No.: US 7,790,540 B2
(45) Date of Patent: Sep. 7, 2010

(54) STRUCTURE AND METHOD TO USE LOW K STRESS LINER TO REDUCE PARASITIC CAPACITANCE

(75) Inventors: Haining Yang, Wappingers Falls, NY (US); Wai-Kin Li, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 263 days.

(21) Appl. No.: 11/467,186

(22) Filed: Aug. 25, 2006

(65) Prior Publication Data
US 2008/0048271 A1 Feb. 28, 2008

(51) Int. Cl.
*H01L 21/8238* (2006.01)
(52) U.S. Cl. ............................ 438/199; 257/E21.632
(58) Field of Classification Search .................. 438/299, 438/238, 780, 197, 199, 201; 257/E21.632
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 4,969,023 A | 11/1990 | Svedberg | |
| 5,006,913 A | 4/1991 | Sugahara et al. | |
| 5,060,030 A | 10/1991 | Hoke et al. | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,268,330 A | 12/1993 | Givens et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |

(Continued)

FOREIGN PATENT DOCUMENTS

JP 6476755 3/1989

OTHER PUBLICATIONS

Rim et al., "Transductance Enhancement in Deep Submicron Strained-Si n-MOSFETs", International Electron Devices Meeting, IEEE, 1998, 26.8.1 - 26.8.4.

(Continued)

*Primary Examiner*—W. David Coleman
*Assistant Examiner*—Latanya Crawford
(74) *Attorney, Agent, or Firm*—Scully, Scott, Murphy & Presser, P.C.; Katherine S. Brown, Esq.

(57) ABSTRACT

A low k stress liner, which replaces conventional stress liners in CMOS devices, is provided. In one embodiment, a compressive, low k stress liner is provided which can improve the hole mobility in pFET devices. UV exposure of this compressive, low k material results in changing the polarity of the low k stress liner from compressive to tensile. The use of such a tensile, low k stress liner improves electron mobility in nFET devices.

10 Claims, 4 Drawing Sheets

U.S. PATENT DOCUMENTS

| | | | |
|---|---|---|---|
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy | |
| 5,583,369 A | 12/1996 | Yamazaki et al. | |
| 5,592,007 A | 1/1997 | Leedy | |
| 5,592,009 A | 1/1997 | Hideka | |
| 5,592,018 A | 1/1997 | Leedy | |
| 5,670,798 A | 9/1997 | Schetzina | |
| 5,679,965 A | 10/1997 | Schetzina | |
| 5,683,934 A | 11/1997 | Candelaria | |
| 5,698,869 A | 12/1997 | Yoshimi et al. | |
| 5,840,593 A | 11/1998 | Leedy | |
| 5,841,170 A | 11/1998 | Adan et al. | |
| 5,861,651 A | 1/1999 | Brasen et al. | |
| 5,880,040 A | 3/1999 | Sun et al. | |
| 5,940,716 A | 8/1999 | Jin et al. | |
| 5,940,736 A | 8/1999 | Brady et al. | |
| 5,946,559 A | 8/1999 | Leedy | |
| 5,960,297 A | 9/1999 | Saki | |
| 5,989,978 A | 11/1999 | Peidous | |
| 6,008,126 A | 12/1999 | Leedy | |
| 6,025,280 A | 2/2000 | Brady et al. | |
| 6,046,464 A | 4/2000 | Schetzina | |
| 6,066,545 A | 5/2000 | Doshi et al. | |
| 6,090,684 A | 7/2000 | Ishitsuka et al. | |
| 6,107,143 A | 8/2000 | Park et al. | |
| 6,117,722 A | 9/2000 | Wuu et al. | |
| 6,133,071 A | 10/2000 | Nagai | |
| 6,165,383 A | 12/2000 | Chou | |
| 6,221,735 B1 | 4/2001 | Manley et al. | |
| 6,228,694 B1 | 5/2001 | Doyle et al. | |
| 6,246,095 B1 | 6/2001 | Brady et al. | |
| 6,255,169 B1 | 7/2001 | Li et al. | |
| 6,255,695 B1 | 7/2001 | Kubota et al. | |
| 6,261,964 B1 | 7/2001 | Wu et al. | |
| 6,265,317 B1 | 7/2001 | Chiu et al. | |
| 6,274,444 B1 | 8/2001 | Wang | |
| 6,281,532 B1 | 8/2001 | Doyle et al. | |
| 6,284,623 B1 | 9/2001 | Zhang et al. | |
| 6,284,626 B1 | 9/2001 | Kim | |
| 6,319,794 B1 | 11/2001 | Akatsu et al. | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,403,486 B1 | 6/2002 | Lou | |
| 6,403,975 B1 | 6/2002 | Brunner et al. | |
| 6,406,973 B1 | 6/2002 | Lee | |
| 6,461,936 B1 | 10/2002 | von Ehrenwall | |
| 6,468,872 B1 | 10/2002 | Yang | |
| 6,476,462 B2 | 11/2002 | Shimizu et al. | |
| 6,483,171 B1 | 11/2002 | Forbes et al. | |
| 6,493,497 B1 | 12/2002 | Ramdani et al. | |
| 6,498,358 B1 | 12/2002 | Lach et al. | |
| 6,501,121 B1 | 12/2002 | Yu et al. | |
| 6,506,652 B2 | 1/2003 | Jan et al. | |
| 6,509,618 B2 | 1/2003 | Jan et al. | |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 6,570,169 B2 | 5/2003 | Suguro et al. | |
| 6,573,172 B1 * | 6/2003 | En et al. | 438/626 |
| 6,605,498 B1 | 8/2003 | Murthy et al. | |
| 6,621,131 B2 | 9/2003 | Murthy et al. | |
| 6,621,392 B1 | 9/2003 | Volant et al. | |
| 6,635,506 B2 | 10/2003 | Volant et al. | |
| 6,717,216 B1 | 4/2004 | Doris et al. | |
| 6,806,584 B2 | 10/2004 | Fung et al. | |
| 6,815,278 B1 | 11/2004 | Ieong et al. | |
| 6,825,529 B2 | 11/2004 | Chidambarrao et al. | |
| 6,831,292 B2 | 12/2004 | Currie et al. | |
| 6,869,866 B1 | 3/2005 | Chidambarrao et al. | |
| 6,890,808 B2 | 5/2005 | Chidambarrao et al. | |
| 6,930,030 B2 | 8/2005 | Rausch et al. | |
| 6,964,892 B2 | 11/2005 | Clevenger et al. | |
| 6,974,981 B2 | 12/2005 | Chidambarrao et al. | |
| 6,977,194 B2 | 12/2005 | Belyansky et al. | |
| 6,998,657 B2 | 2/2006 | Rhodes | |
| 7,015,082 B2 | 3/2006 | Doris et al. | |
| 7,265,061 B1 * | 9/2007 | Cho et al. | 438/764 |
| 7,268,024 B2 | 9/2007 | Yeo et al. | |
| 7,528,465 B2 | 5/2009 | King et al. | |
| 2001/0009784 A1 | 7/2001 | Ma et al. | |
| 2002/0022326 A1 * | 2/2002 | Kunikiyo | 438/296 |
| 2002/0063292 A1 | 5/2002 | Armstrong et al. | |
| 2002/0074598 A1 | 6/2002 | Doyle et al. | |
| 2002/0086472 A1 | 7/2002 | Roberds et al. | |
| 2002/0086497 A1 | 7/2002 | Kwok | |
| 2002/0090791 A1 | 7/2002 | Doyle et al. | |
| 2003/0032261 A1 | 2/2003 | Yeh et al. | |
| 2003/0040158 A1 | 2/2003 | Saitoh | |
| 2003/0057184 A1 | 3/2003 | Yu et al. | |
| 2003/0067035 A1 | 4/2003 | Tews et al. | |
| 2003/0089922 A1 * | 5/2003 | Fujinaga et al. | 257/200 |
| 2003/0129791 A1 | 7/2003 | Yamazaki | |
| 2003/0181005 A1 | 9/2003 | Hachimine et al. | |
| 2004/0029323 A1 | 2/2004 | Shimizu et al. | |
| 2004/0051144 A1 | 3/2004 | Webb et al. | |
| 2004/0113174 A1 | 6/2004 | Chidambarrao et al. | |
| 2004/0113217 A1 | 6/2004 | Chidambarrao et al. | |
| 2004/0173815 A1 | 9/2004 | Yeo et al. | |
| 2004/0183204 A1 * | 9/2004 | Cave et al. | 257/774 |
| 2004/0238914 A1 | 12/2004 | Deshpande et al. | |
| 2004/0262784 A1 | 12/2004 | Doris et al. | |
| 2005/0017304 A1 | 1/2005 | Matsushita | |
| 2005/0040460 A1 | 2/2005 | Chidambarrao et al. | |
| 2005/0082634 A1 | 4/2005 | Doris et al. | |
| 2005/0093030 A1 | 5/2005 | Doris et al. | |
| 2005/0098234 A1 | 5/2005 | Nakaharai et al. | |
| 2005/0098829 A1 | 5/2005 | Doris et al. | |
| 2005/0106799 A1 | 5/2005 | Doris et al. | |
| 2005/0139929 A1 | 6/2005 | Rost | |
| 2005/0145954 A1 | 7/2005 | Zhu et al. | |
| 2005/0148146 A1 | 7/2005 | Doris et al. | |
| 2005/0194699 A1 | 9/2005 | Belyansky et al. | |
| 2005/0236668 A1 | 10/2005 | Zhu et al. | |
| 2005/0245017 A1 | 11/2005 | Belyansky et al. | |
| 2005/0245081 A1 * | 11/2005 | Chakravarti et al. | 438/680 |
| 2005/0260808 A1 * | 11/2005 | Chen et al. | 438/197 |
| 2005/0280051 A1 | 12/2005 | Chidambarrao et al. | |
| 2005/0282325 A1 | 12/2005 | Belyansky et al. | |
| 2006/0022266 A1 | 2/2006 | Messenger et al. | |
| 2006/0027868 A1 | 2/2006 | Doris et al. | |
| 2006/0057787 A1 | 3/2006 | Doris et al. | |
| 2006/0060925 A1 | 3/2006 | Doris et al. | |
| 2006/0094212 A1 | 5/2006 | Noguchi et al. | |
| 2006/0157795 A1 * | 7/2006 | Chen et al. | 257/369 |
| 2006/0172481 A1 * | 8/2006 | Tsui et al. | 438/199 |
| 2006/0177998 A1 | 8/2006 | Lin et al. | |
| 2006/0199326 A1 * | 9/2006 | Zhu et al. | 438/201 |
| 2006/0246641 A1 | 11/2006 | Kammler et al. | |
| 2006/0246672 A1 * | 11/2006 | Chen et al. | 438/301 |
| 2006/0289909 A1 * | 12/2006 | Gluschenkov et al. | 257/288 |
| 2007/0013070 A1 * | 1/2007 | Liang et al. | 257/758 |
| 2007/0018252 A1 * | 1/2007 | Zhu | 257/369 |
| 2007/0037383 A1 * | 2/2007 | Ahn et al. | 438/633 |
| 2007/0048995 A1 * | 3/2007 | Kawanami et al. | 438/597 |
| 2007/0108525 A1 * | 5/2007 | Yang et al. | 257/351 |
| 2007/0222081 A1 * | 9/2007 | Chen et al. | 257/773 |
| 2007/0257315 A1 | 11/2007 | Bedell et al. | |
| 2007/0296027 A1 * | 12/2007 | Yang et al. | 257/327 |
| 2008/0026517 A1 * | 1/2008 | Grudowski et al. | 438/197 |
| 2008/0026523 A1 * | 1/2008 | Lee et al. | 438/231 |

| 2008/0044967 A1* | 2/2008 | Teh et al. ............ 438/199 |

OTHER PUBLICATIONS

Rim et al., "Characteristics and Device Design of Sub-100 nm Strained Si N- and PMOSFETs", Symposium on VLSI Technology Digest of Technical Papers, IEEE, 2002, pp. 98-99.

Scott et al., NMOS Drive Current Reduction Caused by Transistor Layout and Trench Isolation Induced Stress, International Electron Devices Meeting, IEEE, 1999, 34.4.1 - 34.4.4.

Ootsuka et al., "A Highly Dense, High-Performance 130nm Node CMOS Technology for Large Scale System-on-a-Chip Applications", International Electron Devices Meeting, IEEE, 2000, 23.5.1 - 23.5.4.

Ito et al., "Mechanical Stress Effect of Etch-Stop Nitride and its Impact on Deep Submicron Transistor Design", International Electron Devices Meeting, IEEE, 2000, 10.7.1 - 10.7.4.

Shimizu et al., "Local Mechanical-Stress Control (LMC): A New Technique for CMOS-Performance Enhancement", International Electron Devices Meeting, IEEE, 2001, 19.4.1 - 19.4.4.

Ota et al., "Novel Locally Strained Channel Technique for High Performance 55nm CMOS", International Electron Devices Meeting, IEEE, 2002, pp. 27-30, 2.2.1 - 2.2,4.

Zhang et al. "A New 'Mixed-Mode' Reliability Degradation Mechanism in Advanced Si and SiGe Bipolar Transistors", IEEE, 2002, pp. 2151-2156.

Momose et al, "Temperature Dependence of Emitter-Base Reverse Stress Degradation and its Mechanism Analyzed by MOS Structures", IEEE, Paper 6.2, 1989, pp. 140-143.

Huang et al, "Temperature Dependence and Post-Stress Recovery of Hot Electron Degradation Effects in Bipolar Transistors", Bipolar Circuits and technology Meeting 7.5, IEEE, 1991, pp. 170-173.

Sheng et al., "Degradation and Recovery of SiGe HBTs Following Radiation and Hot-Carrier Stressing", pp. 14-15.

Yang et al., "Avalanche Current Induced Hot Carrier Degradation in 200GHz SiGe Heterojunction Bipolar Transistors".

Li et al., "Design of W-Band VCOs with high Output Power for Potential Application in 77GHz Automotive Radar Systems", GaAs Digest, IEEE, 2003, pp. 263-266.

Wurzer et al. "Annealing of Degraded npn-Transistors-Mechanisms and Modeling", Transactions on Electron Devices, IEEE, 1994, pp. 533-538, vol, 41, No. 4.

Doyle et al., "Recovery of Hot-Carrier Damage in Reoxidized Nitrided Oxide MOSFET's" Electron Device Letters, ' IEEE, 1992, pp. 38-40, vol. 13, No. 1.

Momose et al., "Analysis of the Temperature Dependence of Hot-Carrier-Induced Degradation in Bipolar Transistors for Bi-CMOS", Transactions on Electron Devices, IEEE, 1994, pp. 978-987, vol. 41, No. 6.

Khater et al., "SiGe HBT Technology with Fmax/Ft = 350/300 GHz and Gate Delay Below 3.3 ps", IEEE, 2004.

Bean et al., "GEx Si1-x/Si Strained-Layer Superlattice Grown by Molecular Beam Epitaxy", J. Vac. Sci. Technol., 1984, pp. 436-440, vol. A 2, No. 2.

Van Der Merwe, "Regular Articles", Journal of Applied Physics, 1963, pp. 117-122, vol. 34, No. 1.

Matthews et al., "Defects in Epitaxial Multilayers", Journal of Crystal Growth, 1974, pp. 118-125, vol. 27.

Iyer et al., "Heterojunction Bipolar Transistors Using Si-Ge Alloys", Transactions on Electron Devices, IEEE, 1989, pp. 2043-2064, vol. 36, No. 10.

Van De Leur et al., "Critical Thickness for Pseudomorphic Growth of Si/Ge Alloys and Superlattices", J. Appl. Phys., 1988, pp. 3043-3050, vol. 64, No. 6.

Houghton et al., "Equilibrium Critical Thickness for Si1-xGex Strained Layers on (100) Si", Appl. Phys. Lett., 1990, pp. 460-462, vol. 56, No. 29.

Ouyang et al., "Two-Dimensional Bandgap Engineering in a NOVEL Si/SiGe pMOSFET With Enhanced Device Performance and Scalability," IEEE, 2000, pp. 151-154.

\* cited by examiner

STRUCTURE AND METHOD TO USE LOW K STRESS LINER TO REDUCE PARASITIC CAPACITANCE

FIELD OF THE INVENTION

The present invention relates to a semiconductor structure and a method of fabricating the same. More particularly, the present invention relates to a complementary metal oxide semiconductor (CMOS) structure including a low dielectric constant (k) stress liner which is employed to incorporate mechanical stress into the device channel, while significantly reducing the parasitic capacitance of the device.

BACKGROUND OF THE INVENTION

For more than three decades, the continued miniaturization of silicon metal oxide semiconductor field effect transistors (MOSFETs) has driven the worldwide semiconductor industry. Various showstoppers to continue scaling have been predicated for decades, but a history of innovation has sustained Moore's Law in spite of many challenges. However, there are growing signs today that metal oxide semiconductor transistors are beginning to reach their traditional scaling limits.

Since it has become increasingly difficult to improve MOSFETs and therefore CMOS performance through continued scaling, methods for improving performance without scaling have become critical. One approach for doing this is to increase carrier (electron and/or hole) mobilities. Increased carrier mobility can be obtained, for example, by introducing the appropriate stress/strain into the semiconductor lattice.

The application of stress changes the lattice dimensions of the semiconductor substrate. By changing the lattice dimensions, the electronic band structure of the material is changed as well. The change may only be slight in intrinsic semiconductors resulting in only a small change in resistance, but when the semiconducting material is doped, i.e., n-type, and partially ionized, a very small change in the energy bands can cause a large percentage change in the energy difference between the impurity levels and the band edge. This results in changes in carrier transport properties, which can be dramatic in certain cases. The application of physical stress (tensile or compressive) can be further used to enhance the performance of devices fabricated on the semiconductor substrates.

Compressive strain along the device channel increases drive current in p-type field effect transistors (pFETs) and decreases drive current in n-type field effect transistors (nFETs). Tensile strain along the device channel increases drive current in nFETs and decreases drive current in pFETs.

Stress can be introduced into a single crystal oriented substrate by several methods including, for example, forming a stress liner on top of the substrate and around the gate region. Depending on the conductivity type of the FET (i.e., p or n), the stress liner can be under tensile stress (preferred for nFETs) or compressive stress (preferred for pFETs).

When nFETs and pFETs are integrated onto the same semiconductor substrate, dual stress liner technology is typically used in which a first stress liner under tensile stress is formed around each nFET, while a second stress liner under compressive stress is formed around each pFET. In such technologies, the stress liners are formed one on top of another without the need to etch the tensile stressed liner for the nFETs.

In the prior art, $Si_3N_4$ is typically used as the stress inducing material. $Si_3N_4$ is also used as a barrier layer to block ionic metal diffusion from metallic interconnects into the substrate.

Despite the above uses, $Si_3N_4$ has a dielectric constant (k) of about 7.0. Moreover, a $Si_3N_4$ stress liner, which has a deposited thickness of about 100 nm or greater, significantly increases the capacitance between neighboring transistor gates and between contacts and transistor gates.

As such, a new and improved stress liner is needed for CMOS devices that have a low dielectric constant k (on the order of less than 4.0). The use of such a low k stress liner will reduce the parasitic capacitance in the device thereby improving the performance of the device.

SUMMARY OF THE INVENTION

The present invention provides a low k stress liner which replaces conventional stress liners in CMOS devices. A compressive, low k stress liner is provided which can improve the hole mobility in pFET devices. UV exposure of this compressive, low k material results in changing the polarity of the low k stress liner from compressive to tensile. The use of such a tensile, low k stress liner improves electron mobility in nFET devices.

In general terms, the present invention provides a semiconductor structure including a low k stress liner that comprises:

a semiconductor substrate having at least one field effect transistor (FET) located thereon; and a stress liner located on a portion of said semiconductor substrate and surrounding said at least one FET, wherein said stress liner has a dielectric constant of less than 4.0.

In one embodiment of the present invention, the at least one FET is an nFET, and said stress liner is a tensile stress liner having a dielectric constant of less than 4.0. In another embodiment of the present invention, the at least one FET is a pFET, and said stress liner is a compressive stress liner having a dielectric constant of less than 4.0. In yet another embodiment, the at least one FET includes a pFET and an nFET which are separated by an isolation region, wherein said pFET is surrounded by a compressive, low k stress liner and said nFET is surrounded by a tensile, liner k stress liner. In such an embodiment, the compressive and stress liners are comprised of a single material wherein a portion thereof that lies atop the nFET is subjected to UV treatment.

In some embodiments of the present invention, an ion diffusion barrier layer is formed atop the low k stress liner. In yet other embodiments, an interlevel dielectric including at least one metallic contact can also be formed.

In accordance with the present invention, the low k stress liner comprises a silsesquioxane, a carbon doped oxide (i.e., an organosilicate) comprising atoms of Si, C, O and H, a nitrogen and hydrogen doped silicon carbide comprising atoms of Si, C, N and H or multilayers thereof. In one embodiment of the present invention, the low k stress liner is a nitrogen and hydrogen doped silicon carbide, SiC(N,H).

In addition to the above, the present invention also relates to a method of fabricating such a semiconductor structure. In general terms, the method of the present invention comprises:

providing at least one field effect transistor (FET) on a surface of a semiconductor substrate; and forming a stress liner on a portion of said semiconductor substrate and surrounding said at least one FET, wherein said stress liner has a dielectric constant of less than 4.0.

In one embodiment of the present invention, a compressive, low k stress liner is provided by selecting appropriate deposition conditions. In another embodiment of the present invention, a tensile, low k stress liner is provided by deposition of a low k material and exposing the same to UV light.

The UV light exposure changes the polarity of the low k stress liner from compressive to tensile.

DETAILED DESCRIPTION OF THE INVENTION

The present invention, which provides a semiconductor structure including a low k stress liner that is employed to incorporate mechanical stress into the device channel, while significantly reducing the parasitic capacitance of the device and a method of fabricating the same, will now be described in greater detail by referring to the following discussion and drawings that accompany the present application. It is noted that the drawings of the present application are provided for illustrative purposes and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, the present invention provides a low k stress liner which replaces conventional stress liners in CMOS devices. A compressive, low k stress liner is provided which can improve the hole mobility in pFET devices. UV exposure of this compressive, low k material results in changing the polarity of the low k stress liner from compressive to tensile. The use of such a tensile, low k stress liner improves electron mobility in nFET devices.

Figure 1A:
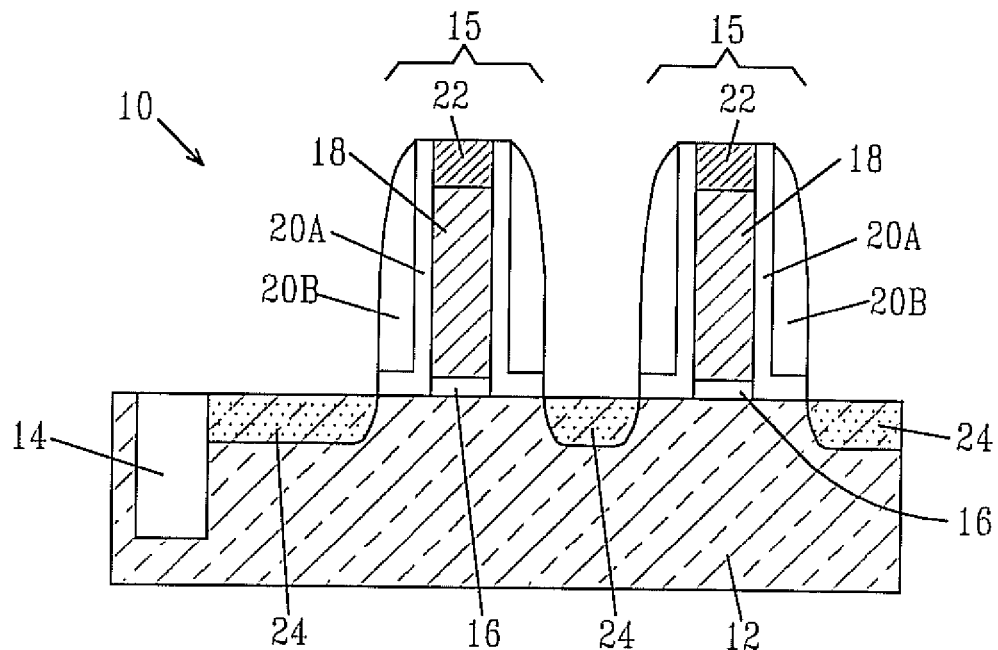
FIGS. 1A-1C are pictorial representations (through cross sectional views) illustrating the basic processing steps used in forming a low k stress liner.
Figure 1B:
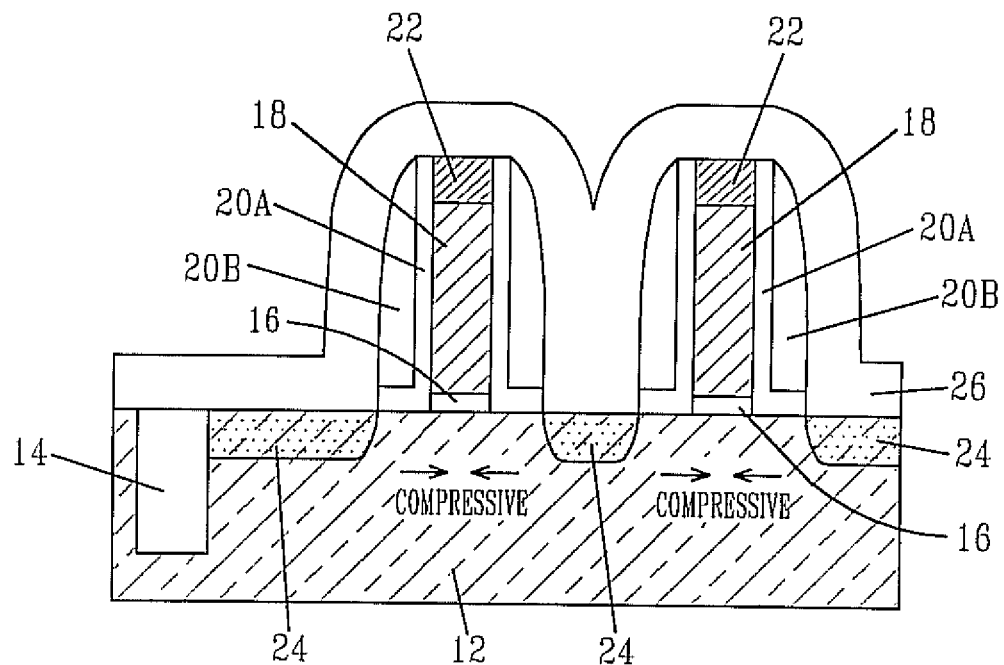
Figure 1C:
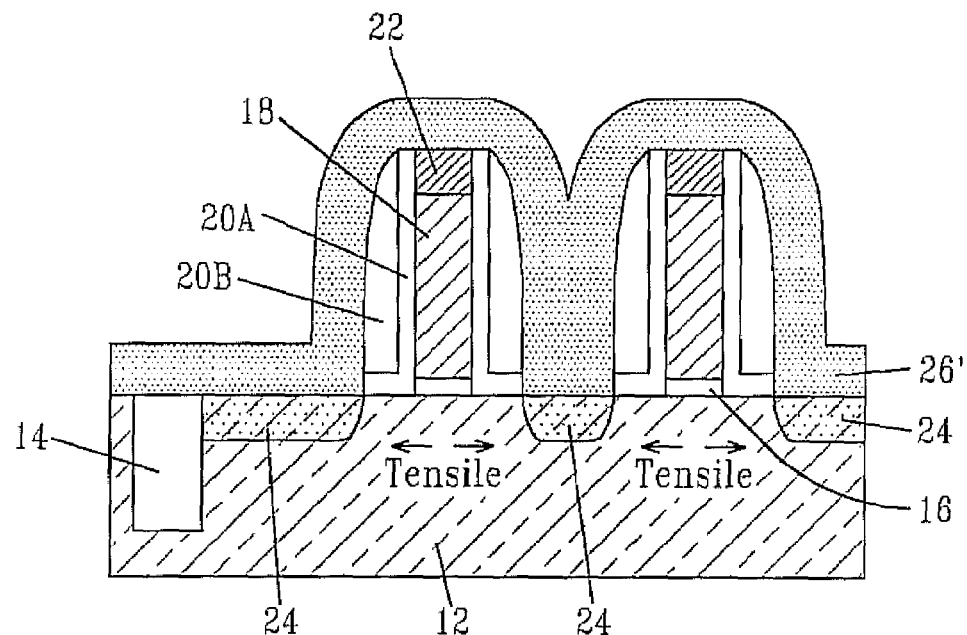

Reference is now made to FIGS. 1A-1C which illustrates the basic processing steps employed in one embodiment of the present application. Specifically, the inventive method begins by providing a semiconductor structure 10 that includes a semiconductor substrate 12 that optionally includes at least one isolation region 14 therein. The semiconductor structure 10 shown in FIG. 1A also includes at least one field effect transistor (FET) 15 located on the surface of the semiconductor substrate 12. In FIG. 1A, two FETs and shown by way of example.

Each FET includes at least a gate dielectric 16, a gate electrode 18 and at least one spacer. In FIG. 1A, a pair of spacers 20A and 20B is shown by way of example. Each FET 15 may also include an optional silicide contact or capping layer 22 located atop the gate electrode 18. In FIG. 1A, silicided source/drain regions 24 are shown in the semiconductor substrate 12. The silicided source/drain regions 24 have an edge that is typically self-aligned to an outer edge of the at least one spacer.

In accordance with the present invention, the at least one FET 15 can be an nFET or a pFET. In some embodiments of the present invention, the at least one FET 15 comprises at least one nFET and at least one pFET which are isolated from each other by an isolation region that is located in the substrate.

The semiconductor structure 10 shown in FIG. 1A is fabricated using conventional complementary metal oxide semiconductor processing techniques well known to those skilled in the art. For example, deposition of various material layers, lithography, etching, ion implantation and annealing can be used in forming the FETs. A conventional self-aligned silicidation process can be used in forming the silicided regions shown in FIG. 1A. The structure shown in FIG. 1A can also be formed utilizing a replacement gate process.

The semiconductor substrate 12 includes any semiconductor material including, for example, Si, SiC, SiGeC, Ge, SiGe, Ga, GaAs, InAs, InP as well as other III/V or II/VI compound semiconductors. Layered semiconductors such as, for example, Si/SiGe and semiconductor-on-insulators (SOIs) are also contemplated herein. Typically, the semiconductor substrate 12 is a Si-containing semiconductor such as, for example, Si, SiC, SiGe, SiGeC, or a silicon-on-insulator. The substrate 12 may be unstrained, strained or include regions of strain and unstrain therein. The substrate 12 may be intrinsic or it may be doped with, for example, but not limited to: B, As or P.

When SOI substrates are employed, those substrates include top and bottom semiconductor, e.g., Si, layers that are separated at least in part by a buried insulating layer. The buried insulating layer includes, for example, a crystalline or non-crystalline oxide, nitride or any combination thereof. Preferably, the buried insulating layer is an oxide. Typically, the buried insulating layer is formed during initial stages of a layer transfer process or during an ion implantation and annealing process, such as, for example, SIMOX (separation by ion implantation of oxygen).

The substrate 12 may have a single crystal orientation or alternatively hybrid semiconductor substrates having surface regions of different crystal orientations can also be employed. The hybrid substrate allows for fabricating a FET upon a specific crystal orientation that enhances the performance of each FET formed. For example, the hybrid substrate allows for providing a structure in which a pFET can be formed on a (110) crystal orientation, while the nFET can be formed on a (100) crystal orientation. When a hybrid substrate is used, it may have SOI-like properties, bulk-like properties or a combination of SOI- and bulk-like properties.

In some embodiments of the present invention, at least one isolation region 14 is formed into the substrate 12. The at least one isolation region 14 may include a trench isolation region, a field oxide isolation region or combinations thereof. The isolation regions are formed utilizing processing techniques well known to those skilled in the art. The isolation regions are typically used to electrically isolate FETs having different polarities from one another.

The gate dielectric 16 present in each of the FETs 15 can comprise the same or different insulating material. For example, the gate dielectric 16 can be comprised of an oxide, nitride, oxynitride, high k material (i.e., a dielectric material having a dielectric constant that is greater than silicon dioxide) or any combination thereof including multilayers. Preferably, the gate dielectric 16 is comprised of an oxide such as, for example, $SiO_2$. The thickness of the gate dielectric 16 is typically from about 0.5 to about 15 nm.

The gate electrode 18 of each of the FETs 15 can be comprised of the same or different conductive material, including, for example, polySi, SiGe, a metal, a metal alloy, a metal silicide, a metal nitride or combinations including multilayers thereof. Preferably, the gate electrode 18 comprises polySi or polySiGe. When multilayers are present, a diffusion barrier (not shown), such as TiN or TaN, can be positioned between each of the conductive layers. The thickness of the gate electrode 18 is typically from about 100 to about 1000 nm.

In some embodiments, a capping layer, such as an oxide, or nitride, can be located atop the gate electrode 18. The presence of the capping layer can be used to prevent subsequent formation of a silicide contact on the gate electrode 18. In another embodiment of the present invention, a silicide contact is present atop the gate electrode 18. The silicide contact is typically formed when the gate electrode 18 includes a Si-containing material and no capping layer is present. In FIG. 1A, reference numeral 22 denotes either the capping layer or the silicide contact.

The at least one spacer that is optionally present is typically comprised of an oxide, nitride or oxynitride including combinations and multilayers thereof. Although optional, typically one spacer is present in the inventive structure. In the illustrated example, a pair of spacers is shown. Typically, the inner L-shaped spacer 20A is typically comprised of an oxide, while the outer spacer 20B is typically comprised of a nitride.

Each FET 15 also includes silicided source/drain (S/D) regions 24 that are formed within the semiconductor substrate 12 utilizing a conventional self-aligned silicidation process. The silicided S/D regions comprise a metal silicide in which the metal is one of Ti, Co, Ni, Pt, Pd, W and other like metals that are capable of reacting with a Si-containing material when heated to a temperature above 350° C. to form a metal silicide.

After providing the semiconductor structure 10 shown in FIG. 1A, a stress liner 26 having a dielectric constant of less than 4.0, preferably less than 3.8, and more preferably less than 3.5, is formed on a portion of the semiconductor substrate 12 and atop the at least one FET 15 such that the stress liner 26 surrounds the at least one FET 15. The resultant structure that is formed after fabricating the stress liner 26 is shown, for example, in FIG. 1B.

In accordance with the present invention, the stress liner 26 comprises any stress inducing material having a dielectric constant that is less than 4.0. Illustrative examples of such low k stress inducing materials include, but are not limited to: a silsesquioxane, a carbon doped oxide (i.e., an organosilicate) comprising atoms of Si, C, O and H, a nitrogen and hydrogen doped silicon carbide comprising atoms of Si, C, N and H or multilayers thereof. In one embodiment of the present invention, the low k stress liner is a nitrogen and hydrogen doped silicon carbide, SiC(N,H).

The stress liner 26 that is formed at this point of the present application is typically a stress liner that is capable of generating a compressive stress in the device channel of the FETs that has a value of about 50 MPa or greater. The device channel is the region of the substrate that is located beneath the gate electrode 18. The stress liner 26 typically has an as-deposited thickness from about 20 to about 250 nm, with a thickness from about 50 to about 100 nm being even more typical.

The stress liner 26 shown in FIG. 1B is formed by a chemical vapor deposition (CVD) process such as, for example, high-density plasma CVD, low pressure (on the order of about 80 torr or less) CVD (LPCVD), plasma enhanced CVD (PECVD) and rapid thermal CVD (RTCVD). Notwithstanding the type of CVD process employed, at least one precursor that is capable forming the stress liner is employed. The at least one precursor may be used in conjunction with an oxidizing agent and/or an inert gas.

The conditions of the chemical vapor deposition are selected to provide a stress liner 26 that is under compressive stress. Typically, such a stress liner 26 can be obtained when the chemical vapor deposition process is carried out at a temperature ranging from about 300° to about 450° C., a pressure ranging from about 0.5 to about 6 torr, and a plasma power level ranging from about 100 to about 1500 W using at least one precursor gas.

In cases wherein the at least one FET 15 is a pFET, no further processing is necessary since the inventive method provides a stress liner having a low k that is under compression atop the pFET.

When the at least one FET 15 is an nFET, further processing is needed which is capable of converting the polarity of stress liner 26 from compressive to tensile. In accordance with the present application, such a polarity conversion of the low k stress liner can be achieved by subjecting the stress liner 26 shown in FIG. 1B to UV treatment, e.g., UV light. The structure that is formed after such UV treatment has been performed is shown, for example, in FIG. 1C. In this drawing, reference numeral 26' denotes a low k stress liner that is under tensile strain.

UV treatment which essentially cures the stress liner 26 comprises placing the structure shown in FIG. 1B into a UV treatment tool. The UV treatment tool has a chamber in which a controlled environment (vacuum or ultra pure gas with a low $O_2$ and/or $H_2O$ concentration) is obtained. The structure, particularly the stress liner 26, is then exposed to ultraviolet (UV) light of a wavelength ranging from about 180 nm to about 600 nm and an energy level ranging from about 10 to about 1000 $mW/cm^2$. When the UV treatment is carried out for a sufficient period of time, exposed portions of the stress liner 26 is converted from being compressively stressed to being tensilely stressed.

The inventors of the present invention have discovered that the stress profiles of certain low k stress inducing materials can be modulated by UV treatment. Therefore, UV treatment can be advantageously used for selectively converting compressive stress in into tensile stress. When the UV treatment is carried out for a duration ranging from about 2.5 to about 15 minutes, a tensile stress ranging from about 100 to about 600 MPa is created. Higher stress (i.e., greater than 600 MPa) can be achieved with optimized UV exposure time and/or low k stress liner composition.

The above processing technique can also be used in fabricating a structure including at least one nFET and at least one pFET including the appropriate stress liners surrounding each of the FETs. In accordance with this aspect of the present invention, the appropriate stress liners surrounding each of the FETs of different polarities are derived from a single, continuous stress liner wherein portions thereof that surround the nFETs have been exposed to UV treatment as described above. During UV treatment, portions of the stress liner that are surrounding the pFETs are protected by a patterned ultraviolet (UV) blocking layer.

The patterned UV blocking layer is formed by deposition, lithography and etching. Any suitable UV blocking material, such as metals, metal nitrides, metal oxides, silicon nitrides, silicon oxides, silicon carbides, polymers, etc., can be used to form the patterned UV blocking layer. Preferably, the patterned UV blocking layer comprises at least one of TiN, Al, and TaN. More preferably, the patterned UV blocking layer comprises TiN.

The entire structure is then exposed to ultraviolet (UV) light as described above. When the UV treatment is carried out for a sufficient period of time, the uncovered region of the stress liner 26 is converted from being compressively stressed to being tensilely stressed, while protected region of the stress liner remains compressively stressed. The tensile, low k stress liner is labeled as 26' in FIG. 2, while the compressive, low k stress liner is labeled as 26. Moreover, in FIG. 2, reference numeral 15' denotes an nFET and reference numeral 15" denotes a pFET.

Figure 2:
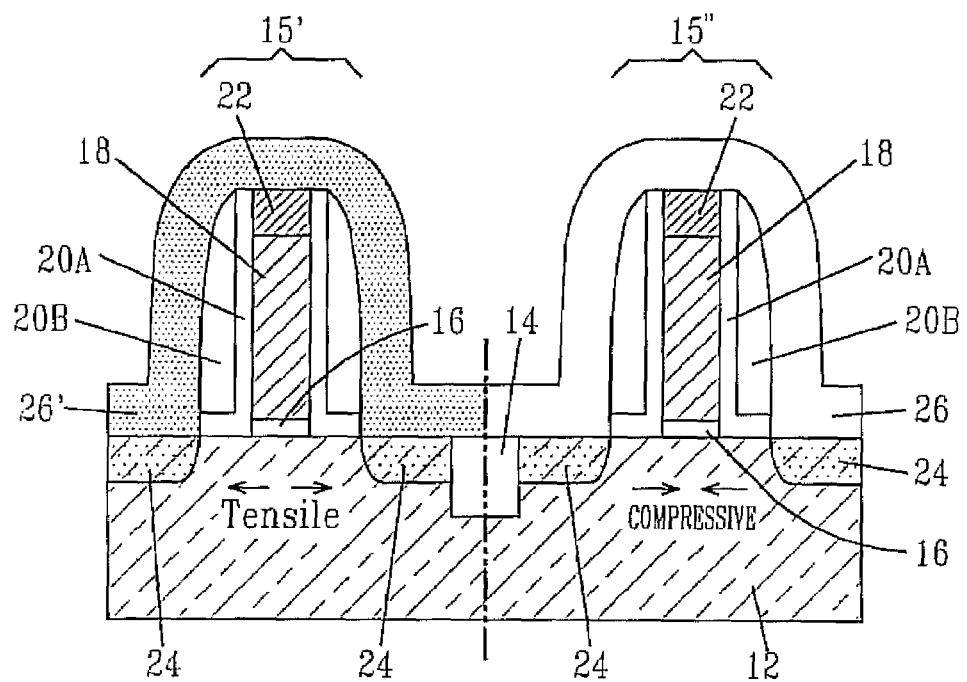
FIG. 2 is a pictorial representation (through a cross sectional view) illustrating a structure including at least one nFET and at least one pFET including the appropriate stress liners surrounding each of the FETs.
Figure 3A:
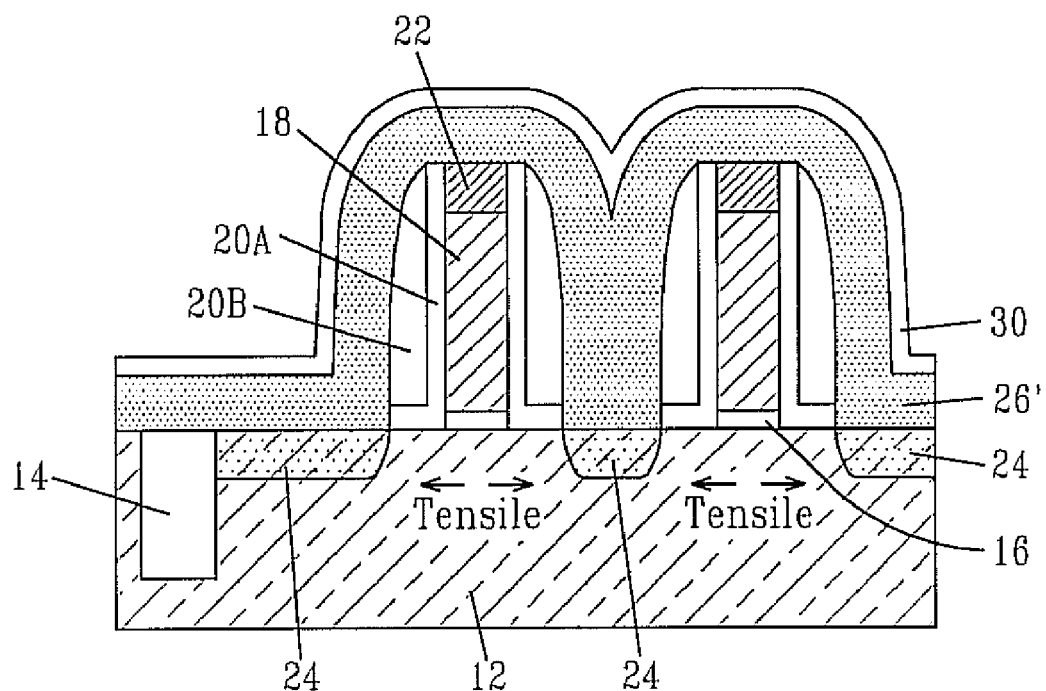
FIGS. 3A-3C are pictorial representations (through cross sectional views) illustrating further processing that can be employed in the present application.
Figure 3B:
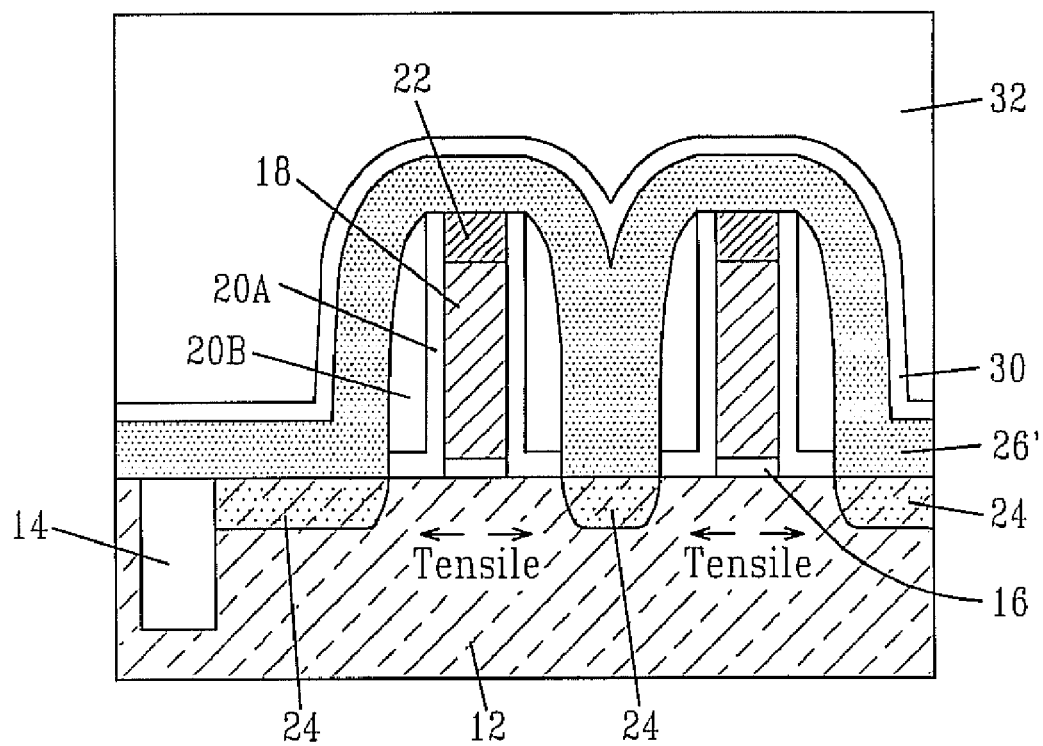
Figure 3C:
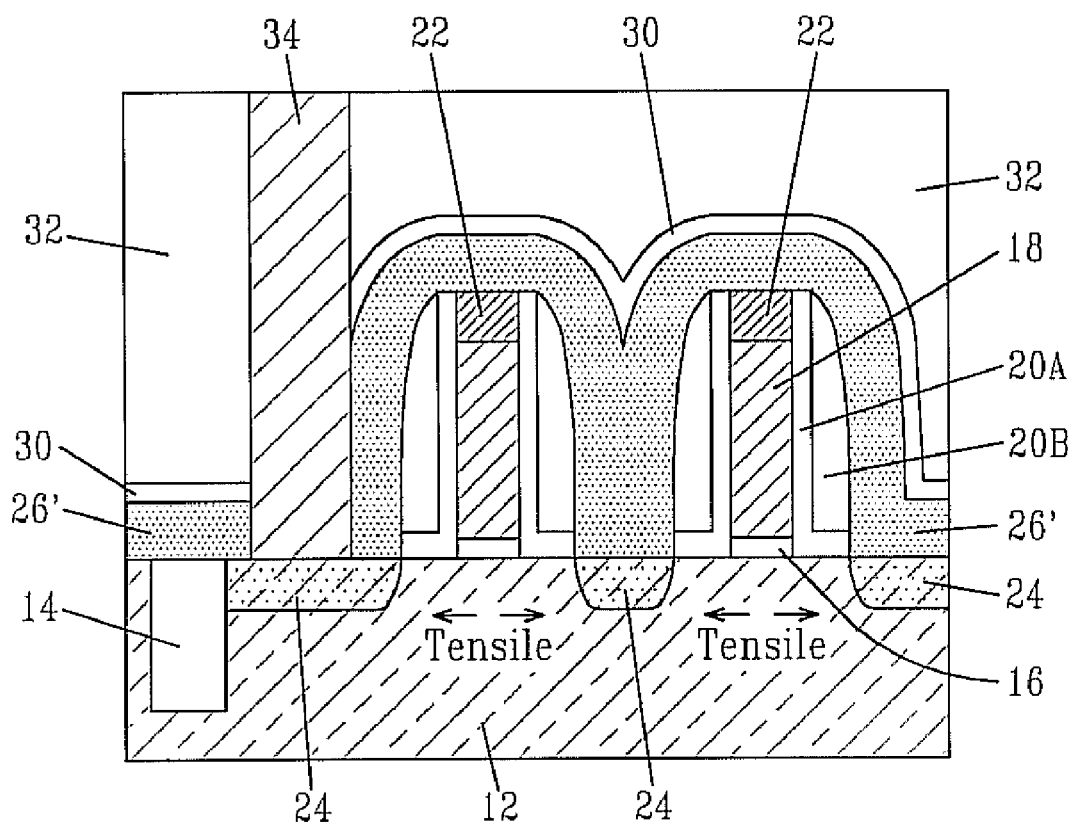

FIGS. 3A-3C illustrate further processing of the present invention which may optionally be performed on either the structure shown in FIG. 1B, 1C or 2. In the particular embodiment illustrated, the further processing is performed on the structure shown in FIG. 1C. The further processing begins by forming an ion diffusion barrier layer 30 on the exposed surface of stress liner 26' so as to provide the structure shown in FIG. 3A.

The ion diffusion barrier layer 30 comprises $Si_3N_4$ or any other material, preferably an insulator, that can serve as a barrier to prevent ions from diffusing there through. The thickness of the diffusion barrier layer 30 may vary depending on the exact means of the deposition process used as well as the material employed. Typically, the diffusion barrier layer 30 has a thickness from about 4 to about 40 nm, with a thickness from about 7 to about 20 nm being more typical. The ion diffusion barrier layer 30 is formed by a conventional deposition process such as, for example, CVD, PECVD, evaporation, chemical solution deposition and atomic layer deposition.

Subsequently, an interlevel dielectric (ILD) layer 32 is deposited over the entire structure, as shown in FIG. 3B. The ILD layer 32 preferably comprises an oxide that is formed by either a high-density plasma (HDP) deposition process or by a tetraethylorthosilicate (TEOS)-based deposition process.

After providing the structure shown in FIG. 3B, at least one metallic contact 34 is formed which extends through the ILD 32, the ion diffusion barrier layer 30 and, the stress liner 26', resting atop the silicided source/drain contacts 24. The at least one metallic contact 34 is formed by lithography, etching, and filling of the thus formed contact opening with a metal such as, for example, Cu, Al, W and alloys thereof.

In accordance with the present invention, the use of a low k stress liner in place of a conventional $Si_3N_4$ stress liner can reduce the contact to gate parasitic capacitance and the gate to gate parasitic capacitance. In particular, a 12% or greater reduction of contact to gate parasitic capacitance can be achieved, while a 10% or greater reduction of gate to gate capacitance can be achieved.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor structure comprising:
   providing at least one field effect transistor (FET) on a surface of a semiconductor substrate, said at least one FET including at least a gate dielectric, an overlying gate electrode, a silicided source region located within the semiconductor substrate on one side of the FET and a silicided drain region located within the semiconductor substrate on another side of the FET;
   forming a compressive stress liner on a portion of said semiconductor substrate and surrounding said at least one FET including atop both the silicided source region and the silicided drain region, wherein said compressive stress liner has a dielectric constant of less than 4.0; and
   subjecting the compressive stress liner to UV treatment, said UV treatment converts said compressive stress liner into a tensile stress liner, said tensile stress liner is located at least atop the at least one FET and the entirety of the silicided source region and the silicided drain region, and wherein said compressive stress liner has a stress value of about 50 MPa or greater, and said tensile stress liner has a stress value of about 100 MPa to about 500 MPa.

2. The method of claim 1 wherein said forming said compressive stress liner comprises chemical vapor deposition of at least one of a silsesquioxane, a carbon doped oxide comprising atoms of Si, C, O and H, and a nitrogen and hydrogen doped silicon carbide comprising atoms of Si, C, N and H.

3. The method of claim 1 wherein said UV treatment comprises exposing said compressive stress liner to UV light having a wavelength ranging from about 180 to about 600 nm at an energy from about 10 to about 1000 $mW/cm^2$.

4. The method of claim 1 further comprising forming an ion diffusion barrier layer and an interlevel dielectric having at least one metallic contact on top of said tensile stress liner.

5. The method of claim 2 wherein said chemical vapor deposition is carried out at a temperature ranging from about 300° to about 450° C., a pressure ranging from about 0.5 to about 6 torr, and a plasma power level ranging from about 100 to about 1500 W.

6. A method of fabricating a semiconductor structure comprising:
   providing at least one n-type field effect transistor (nFET) and at least one p-type field effect transistor (pFET) on a surface of a semiconductor substrate, said at least one nFET and said at least one pFET are separated by an isolation region located within said semiconductor substrate;
   forming a compressive stress liner on a portion of said semiconductor substrate and surrounding said at least one nFET and said at least one pFET, wherein said compressive stress liner has a dielectric constant of less than 4.0;
   forming a patterned UV blocking layer protecting a portion of said compressive stress liner located above and surrounding said at least one pFET, while leaving another portion of the compressive stress liner located above and surrounding said at least one nFET exposed;
   subjecting the exposed portion of the compressive stress liner to UV treatment, said UV treatment converts said exposed portion of the compressive stress liner into a tensile stress portion, while maintaining a compressive stress portion underneath the patterned UV blocking layer; and
   removing said patterned UV blocking layer, wherein an edge of the compressive stress portion is in contact with an edge of the tensile stress portion above the isolation region, and said compressive stress portion and said tensile stress portion form a single, continuous stress liner, and wherein said compressive stress liner has a stress value of about 50 MPa or greater, and said tensile stress liner has a stress value of about 100 MPa to about 500 MPa.

7. The method of claim 6 wherein said forming said compressive stress liner comprises chemical vapor deposition of at least one of a silsesquioxane, a carbon doped oxide comprising atoms of Si, C, O and H, and a nitrogen and hydrogen doped silicon carbide comprising atoms of Si, C, N and H.

8. The method of claim 6 wherein said UV treatment comprises exposing said compressive stress liner to UV light having a wavelength ranging from about 180 to about 600 nm at an energy from about 10 to about 1000 mW/cm$^2$.

9. The method of claim 6 further comprising forming an ion diffusion barrier layer and an interlevel dielectric having at least one metallic contact on top of said single, continuous stress liner.

10. The method of claim 7 wherein said chemical vapor deposition is carried out at a temperature ranging from about 300° to about 450° C., a pressure ranging from about 0.5 to about 6 torr, and a plasma power level ranging from about 100 to about 1500 W.

* * * * *